United States Patent
Ono et al.

(10) Patent No.: US 8,491,983 B2
(45) Date of Patent: Jul. 23, 2013

(54) GLASS SUBSTRATE FOR SEMICONDUCTOR DEVICE COMPONENT AND PROCESS FOR PRODUCING GLASS SUBSTRATE FOR SEMICONDUCTOR DEVICE COMPONENT

(75) Inventors: Motoshi Ono, Tokyo (JP); Akio Koike, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/172,638

(22) Filed: Jun. 29, 2011

(65) Prior Publication Data

US 2011/0256344 A1  Oct. 20, 2011

Related U.S. Application Data

(63) Continuation of application No. PCT/JP2010/051366, filed on Feb. 1, 2010.

(30) Foreign Application Priority Data

Feb. 2, 2009 (JP) ................................ 2009-021751

(51) Int. Cl.
*B32B 3/24* (2006.01)
*B23K 26/40* (2006.01)

(52) U.S. Cl.
USPC .................... 428/131; 219/121.7; 219/121.71

(58) Field of Classification Search
USPC ............................ 428/131; 219/121.7, 121.71
See application file for complete search history.

(56) References Cited

U.S. PATENT DOCUMENTS

| | | | | |
|---|---|---|---|---|
| 6,132,843 A | * | 10/2000 | Kuroda et al. | 428/141 |
| 6,693,257 B1 | * | 2/2004 | Tanaka | 219/121.76 |
| 7,425,166 B2 | * | 9/2008 | Burt et al. | 445/25 |
| 2006/0094584 A1 | * | 5/2006 | Shojiya et al. | 501/55 |
| 2010/0119808 A1 | * | 5/2010 | Li et al. | 428/312.6 |

FOREIGN PATENT DOCUMENTS

| | | |
|---|---|---|
| JP | 2002-126886 | 5/2002 |
| JP | 2005-088045 | 4/2005 |
| JP | 2008-119698 | 5/2008 |
| JP | 2008-156200 | 7/2008 |
| JP | 2008-260642 | 10/2008 |
| WO | WO-2004/063109 A1 | 7/2004 |

OTHER PUBLICATIONS

International Search Report in PCT/JP2010/051366 dated Mar. 2, 2010.
Keiper, B. et al. "Drilling of Glass by Excimer Laser Mask Projection Technique", ICALEO, 1999, M110, pp. 1-7.

* cited by examiner

*Primary Examiner* — William P Watkins, III
(74) *Attorney, Agent, or Firm* — Foley & Lardner LLP

(57) ABSTRACT

It is an object of the present invention to provide a glass substrate having plural through-holes which is not likely to peel from a silicon wafer, even though laminated on and jointed to a the silicon wafer and then subjected to heat treatment. The above object is accomplished by a glass substrate having an average thermal expansion coefficient of from $10 \times 10^{-7}$ to $50 \times 10^{-7}$/K within a range of from 50° C. to 300° C., having plural through-holes with a taper angle of from 0.1 to 20° and having a thickness of from 0.01 to 5 mm.

12 Claims, 2 Drawing Sheets

60 μm

60 μm

GLASS SUBSTRATE FOR SEMICONDUCTOR DEVICE COMPONENT AND PROCESS FOR PRODUCING GLASS SUBSTRATE FOR SEMICONDUCTOR DEVICE COMPONENT

TECHNICAL FIELD

The present invention relates to a glass substrate for a semiconductor device component, which has plural through-holes and its production process.

BACKGROUND ART

In order to respond to a demand for high densification of printed circuit boards along with high-density mounting, a multilayer printed circuit board having plural printed circuit boards laminated one on another has been developed. In the case of such a multilayer printed circuit board, micro through-holes having a diameter of about at most 100 μm so called via holes are formed on an insulating layer made of a resin, and the inside of the through-holes are plated so as to electrically connect conductive layers each other between printed circuit boards which are laminated one above the other.

As the method for easily forming such through-holes, Patent Documents 1 and 2 disclose a method of emitting laser light to an insulating layer through a mask in which plural holes are formed. According to such a method, since plural through-holes can be simultaneously formed on an insulating layer made of a resin, it is considered that many through-holes (via holes) can be easily formed.

Further, in order to respond to a demand to make IC chips small in size and thin, the wafer level package (WLP) technique is often utilized in recent years. The WLP technique is a technique such that a wafer surface on which IC is formed is subjected to re-wiring, solder bump printing, resin sealing or the like required for semiconductor packages, and then the wafer is die-cut into individual wafers, whereby the package size of the wafer is reduced to the same level of IC chips. In WLP, silicon wafers sealed with a resin are usually die-cut into individual wafers. However, in recent years, silicon wafers bonded to glass by anode joint or the like are used from the viewpoint of reliability. In a case where glass used in WLP is used for through-holes or a sensor for electrodes, through-holes for informing information of air (temperature, pressure, air flow, etc.) directly to chips are additionally formed on the glass.

In addition, since the demand for making semiconductor devices small in size, fast and low energy consumptive is further increasing, the development of the three dimensional SiP technique is in progress in which the system-in-package (SiP) technique to put a system comprising plural LSI in one package and the three dimensional mounting technique are combined. In such a case, wiring bonding cannot be applied to micro pitches, and a connection substrate so called interposer employing through-hole electrodes is required.

PRIOR ARTS

Patent Documents

Patent Document 1: JP-A-2005-88045
Patent Document 2: JP-A-2002-126886

DISCLOSURE OF INVENTION

Problems to be Solved by Invention

In the case of the above insulating layer made of a resin, the positioning accuracy deteriorates due to the influence of warpage, deformation or the like. Therefore, the above insulating layer is not suitable for high density mounting. Accordingly, instead of the above insulating layer made of a resin, it is demanded to employ a glass substrate having an insulating property. However, it is difficult to form plural micro through-holes through a plate glass by emitting laser light through a mask having plural holes under the same condition as in the case of forming through-holes through the insulating layer made of a resin. Through-holes are hardly formed through glass, as compared to resins. Further, since glass is a brittle material, it is difficult to form through-holes without forming cracks. On the other hand, plural through-holes can be simultaneously formed through glass by wet etching or dry etching, however, such methods are not preferred since process steps are complicated, processing time is long, and there are problems such as waste liquid disposal. Further, in the case of the method employing sandblast or ultrasonic wave drill, it is difficult to form micro through-holes, and process steps are complicated. Therefore, silicon is going to be tried as an interposer having through-hole electrodes now. Silicon is relatively easily subjected to microfabrication by dry etching. However, since silicon is semiconductor, an inner wall of the through-holes has to be subjected to insulating treatment in order to secure the insulating property. Therefore, if plural micro through-holes can be formed through glass, such glass is useful as an interposer. Further, as mentioned above, it is difficult to form laser through-holes through a glass substrate provided with through-holes for WLP, and it is usual to use sandblast or ultrasonic wave drill to form through holes. In such a case, it is difficult to form micro through-holes, and the application of such a glass substrate is limited now. Accordingly, it is desired to accomplish the technique to form plural through-holes simultaneously by emitting laser light to a plate glass.

Further, it is considered that depending on its properties, the glass substrate having plural through-holes formed by emitting laser light to a plate glass cannot be used as the above mentioned insulating layer for a multilayer-circuit board, glass for WLP or an interposer in some cases. It is considered that when an insulating layer is laminated on and jointed to a silicon wafer or jointed to silicon for WLP, the insulating layer or WLP glass may exfoliate from the silicon wafer, or the wafer may warp in some cases. Further, it is considered that also when such a glass substrate is used as an interposer, warpage results due to the difference in the thermal expansion coefficient between the glass substrate and chips made of silicon. In addition, particularly the interposer to be used as a high frequency device is desired to have a low dielectric constant and low dielectric loss in order to obtain excellent device properties.

Accordingly, it is an object of the present invention to provide a process for producing the glass substrate by emitting laser light to a plate glass thereby to form plural through-holes simultaneously.

Further, it is an object of the present invention to provide a glass substrate most suitable for WLP and other various semiconductor devices. Particularly, it is an object of the present invention to provide a glass substrate having plural through-holes such that even when the glass substrate is laminated on and jointed to a silicon wafer, the glass substrate is not likely to exfoliate from the silicon wafer, or the silicon wafer is not likely to deform. Further, it is an object of the present invention to provide a glass substrate such that when the glass substrate is used as an interposer, problems such as deformation will not occur, and excellent device properties can be obtained.

Means to Accomplish the Object

The present inventors have found that the above problems can be solved by the following glass substrate and the process. Thus, the present invention has been accomplished.

The present invention provides a glass substrate having an average thermal expansion coefficient of from $10 \times 10^{-7}$ to $50 \times 10^{-7}$/K within a range of from 50° C. to 300° C., having plural through-holes with a taper angle of from 0.1 to 20° and having a thickness of from 0.01 to 5 mm.

Further, the present invention provides a glass substrate for a semiconductor device component, which is a glass plate having a thickness of from 0.01 to 5 mm, an $SiO_2$ content of from 50 to 70 mass % and an average thermal expansion coefficient of from $10 \times 10^{-7}$ to $50 \times 10^{-7}$/K within a range of from 50° C. to 300° C., wherein the glass plate has plural through-holes with a taper angle of from 0.1 to 20°.

Further, the present invention provides a process for producing the above glass substrate for a semiconductor device component by emitting excimer laser light to a plate glass, which comprises the following steps (1) to (6):
(1) a first step of placing an excimer laser light-emitting device,
(2) a second step of placing the plate glass on an optical path of the excimer laser light,
(3) a third step of placing a mask having plural through-holes on the optical path between the excimer laser light-emitting device and the plate glass,
(4) a fourth step of placing a projection lens on the optical path between the mask and the plate glass to reduction-project the image of the mask on the plate glass,
(5) a fifth step of emitting the excimer laser, and
(6) a sixth step of transferring the plate glass.

Further, the present invention provides a process for producing a glass substrate for a semiconductor device component, which comprises passing excimer laser light emitted from an excimer laser light-emitting device through a mask having plural through-holes and having the image of the mask reduction-projected by a projection lens, and irradiating a surface of a plate glass substrate having a thickness of from 0.01 to 5 mm, an $SiO_2$ content of from 50 to 70 mass % and an average thermal expansion coefficient of from $10 \times 10^{-7}$/K to $50 \times 10^{-7}$/K within a range of from 50° C. to 300° C. with the reduction-projected excimer laser light so as to form through-holes corresponding to the through-holes of the mask through the plate glass substrate.

Effects of Invention

According to the present invention, the process for producing the above glass substrate by emitting laser light to a plate glass to form plural through-holes simultaneously can be provided.

Further, according to the present invention, the glass substrate which is most suitable for WLP and other various semiconductor device components can be provided. Particularly, it is possible to provide a glass substrate having plural through-holes such that when the glass substrate is laminated on and jointed to a silicon wafer, the glass substrate is not likely to exfoliate from the silicon wafer, or the silicon wafer is not likely to deform. Further, it is possible to provide a glass substrate such that when the glass substrate is used as an interposer, problems such as deformation are not likely to occur, and excellent device properties can be obtained.

MODE FOR CARRYING OUT INVENTION

Figure 1:
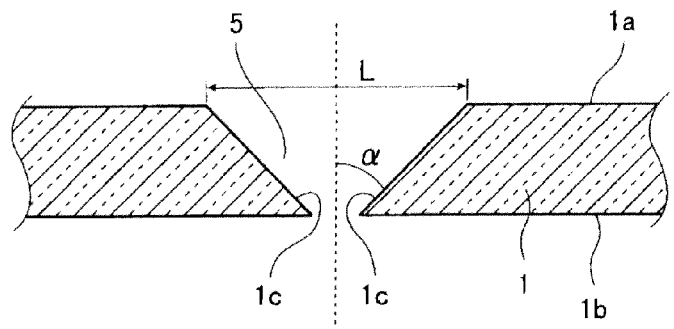
FIG. 1 is an enlarged cross sectional view of a through-hole in the glass substrate of the present invention.

The glass substrate for a semiconductor device component of the present invention will be described.

The glass substrate for a semiconductor device component of the present invention has an average thermal expansion coefficient (hereinafter simply referred to as "thermal expansion coefficient") of from $10 \times 10^{-7}$ to $50 \times 10^{-7}$/K within a range of from 50° C. to 300° C., has plural through-holes with a taper angle of from 0.1 to 20° and has a thickness of from 0.01 to 5 mm.

When such a glass substrate is laminated on a silicon wafer, or chips made of silicon are laminated on such a glass substrate, exfoliation between the glass substrate and the silicon wafer is not likely to occur, and the silicon wafer is not likely to deform. Therefore, such a glass substrate is preferred. The thermal expansion coefficient of the glass substrate is preferably from $25 \times 10^{-7}$ to $45 \times 10^{-7}$/K, more preferably from $30 \times 10^{-7}$ to $40 \times 10^{-7}$/K. In such a case, the exfoliation or deformation is more prevented. Further, in order to obtain matching with a resin substrate such as a mother board, the thermal expansion coefficient is preferably at least $35 \times 10^{-7}$/K.

In the present invention, the average thermal expansion coefficient within a range of from 50 to 300° C. is a value measured by a differential thermal expansion meter (TMA) and obtained in accordance with JIS R3102 (1995).

Plural through-holes in the glass substrate of the present invention are preferably formed by emitting excimer laser light from one main surface of a plate glass to the other main surface. The through-holes are preferably circular and have a diameter of from 5 to 500 μm.

Further, the more preferred range of the diameter of the through-holes varies depending on the application of the glass substrate of the present invention, however, the diameter of the through-holes is usually preferably from 0.005 to 0.5 mm. In a case where the glass substrate of the present invention is used as an insulating layer for the above multilayer circuit substrate, the diameter of the through-holes is more preferably from 0.01 to 0.2 mm, further preferably from 0.02 to 0.1 mm. Further, by employing the wafer level package (WLP) technique, the glass substrate of the present invention is laminated on a wafer to form an IC chip to be used for a pressure sensor, etc. In such a case, the diameter of through-holes for ventilating air is preferably from 0.1 to 0.5 mm, more preferably from 0.2 to 0.4 mm. Further, in such a case, the diameter of through-holes for providing electrodes other than the air holes, is preferably from 0.01 to 0.2 mm, more preferably from 0.02 to 0.1 mm. Particularly, in a case where the glass substrate is used as a through-hole electrode such as an interposer, the diameter of the through-holes is more preferably from 0.005 to 0.075 mm, further preferably from 0.01 to 0.05 mm.

Further, as mentioned later, depending on the condition for emitting excimer laser light, the diameter of the circular through-holes on one main surface may be different from that on the other main surface in some cases, and the diameter of the through-holes in the glass substrate of the present invention means the larger diameter between two main surfaces.

The ratio ($d_s/d_l$) of the smaller diameter ($d_c$) to the larger diameter ($d_l$) is preferably from 0.2 to 0.99, more preferably from 0.5 to 0.90.

The glass substrate of the present invention preferably has a number density of the through-holes of from 0.1 to 10,000/mm$^2$.

The preferred number density of the through-holes varies depending on the application of the glass substrate of the present invention like the diameter of the through-holes, however, the number density of the through-holes is usually preferably from 0.1 to 10,000/mm$^2$. In a case where the glass substrate of the present invention is used as an insulating layer for a multilayer circuit board as described above, the number density of the through-holes is preferably from 3 to 10,000/mm$^2$, more preferably from 25 to 100/mm$^2$. Further, in a case where by employing the wafer level package (WLP) technique, the glass substrate of the present invention is laminated on a wafer to form an IC chip to be used for a pressure sensor, etc., the number density of the through-holes is preferably from 1 to 25/mm$^2$, more preferably from 2 to 10/mm$^2$. In a case where the glass substrate of the present invention is used as a through-hole electrode such as an interposer, the number density of the through-holes is preferably from 0.1 to 100/mm$^2$, more preferably from 0.5 to 500/mm$^2$.

The area of the cross section of the through-holes in the glass substrate of the present invention monotonously decreases from one main surface to the other main surface. This will be explained with reference to FIG. 1.

FIG. 1 is an enlarged cross sectional view of a preferred example of a through-hole in the glass substrate of the present invention. In FIG. 1, 1 is the glass substrate, 1a is one main surface of the glass substrate, and 1b is the other main surface of the glass substrate. Further, L is the above mentioned diameter of the through-hole, and α is an angle between the normal line (dotted line) of both surfaces and the wall surface 1c of the through-hole. α is also referred to as "taper angle". Here, α is explained as an angle on the right side to the normal line in FIG. 1, but an angle between the normal line and the left side wall surface 1c of the through-hole in the same Fig. is also a taper angle α. Usually, the taper angle α on the right side and the taper angle α on the left side are substantially the same.

The glass substrate of the present invention has a taper angle (α) of from 0.1 to 20°, preferably from 0.5 to 10°. With such an angle, at the time of wiring bonding, a wire can be smoothly inserted into the inside of the through-hole from the upper surface (1a) side of the glass substrate, and can more easily and more certainly connect conductive layers each other between printed circuit boards laminated one above the other.

Further, the taper angle is a value calculated from the diameters of the circular through-hole on one main surface and on the other main surface and the thickness of the glass substrate by assuming that the taper angle is uniform.

As mentioned later, according to the process of the present invention, the taper angle can be optionally controlled.

The glass substrate of the present invention has a thickness of from 0.01 to 5 mm, preferably from 0.02 to 3 mm, more preferably from 0.02 to 1 mm. If the thickness of the glass substrate is too thick, it takes time to form through-holes, and if the thickness is too thin, a problem such as breakage results. The thickness of the glass substrate is particularly preferably from 0.05 to 0.4 mm.

The glass substrate of the present invention preferably has an absorption coefficient of at least 3 cm$^{-1}$ to the wavelength of excimer laser light to be used. The higher absorption coefficient is more preferred, since the though-holes can be more easily formed. In order to have excimer laser light more absorbed, the content of Fe is preferably at least 20 mass ppm, more preferably at least 0.01 mass %, further preferably at least 0.03 mass %, particularly preferably at least 0.05 mass %. On the other hand, if the content of Fe is large, coloration becomes remarkable, and a problem may result such that it becomes difficult to adjust a position at the time of laser processing, or sight-check of the shape of holes becomes difficult. The content of Fe is preferably at most 0.2 mass %, more preferably at most 0.1 mass %.

The glass substrate of the present invention preferably has a low alkali content. Specifically, the total content of Na and K as calculated as oxides is preferably at most 3.5 mass %. If the total content of Na and K exceeds 3.5 mass %, the thermal expansion coefficient may exceed 50×10$^{-7}$/K. More preferably, the total content of Na and K is at most 3 mass %. In a case where the glass substrate is used for a high frequency device or in a case where pitches are smaller, for example in a case where many through-holes of at most 50 μm are formed with pitches of at most 200 μm, the glass substrate is particularly preferably alkali free glass. Here, the alkali free glass is glass having the total content of alkali metals as calculated as oxides of less than 0.1 mass %.

Further, in a case where the glass substrate of the present invention is bonded to a silicon wafer by the positive electrode bonding method, the content of Na as calculated as oxide is preferably at least 0.5 mass %, more preferably at least 1.5 mass %.

The glass substrate of the present invention preferably has a dielectric constant of at most 6 at 25° C. at 1 MHz. Further, the glass substrate of the present invention preferably has a dielectric loss of at most 0.005 at 25° C. at 1 MHz. By lowering the dielectric constant and the dielectric loss, excellent device properties can be obtained.

The glass substrate of the present invention preferably has an SiO$_2$ content of from 50 to 70 mass %. If the SiO$_2$ content is high, cracks tend to be formed on the rear surface at a time of forming through-holes. It is known that the behavior of the crack formation on glass is different between glass having a high SiO$_2$ content and glass having a low SiO$_2$ content. In the case of the glass having a high SiO$_2$ content, corn shape cracks tend to be formed by contact to objects. On the other hand, in the case of the glass having a low SiO$_2$ content, such glass tends to be broken by contact to objects. Therefore, breakage or cracks can be prevented by adjusting the SiO$_2$ content in the glass substrate.

As specific examples of the glass substrate, AN100 glass (manufactured by Asahi Glass Company, Limited), EAGLE glass (manufactured by Corning Incorporated) and SW glass (manufactured by Asahi Glass Company, Limited) may be mentioned. These glass substrates have a thermal expansion coefficient of from 10×10$^{-7}$/K to 50×10$^{-7}$/K.

AN100 glass has a thermal expansion coefficient of 38×10$^{-7}$/K, is alkali free glass having the total content of Na$_2$O and K$_2$O of less than 0.1 mass % and has the content of Fe of 0.05 mass %.

SW glass has a thermal expansion coefficient of 36×10$^{-7}$/K, the total content of Na$_2$O and K$_2$O of 3 mass % and the content of Fe of 50 mass ppm.

Now, the production process of the present invention will be described.

The process of the present invention is a process for producing the glass substrate of the present invention by emitting excimer laser light to a plate glass, which comprises the following steps (1) to (6):

(1) a first step of placing an excimer laser light-emitting device, (2) a second step of placing the plate glass on an optical path of the excimer laser light, (3) a third step of placing a mask having plural through-holes on the optical path between the excimer laser light-emitting device and the plate glass, (4) a fourth step of placing a projection lens on the optical path between the mask and the plate glass to reduction-project the image of the mask on the plate glass, (5) a fifth step of emitting the excimer laser light, and (6) a sixth step of transferring the plate glass.

Further, the present invention is a process for producing a glass substrate for a semiconductor device component, which comprises passing excimer laser light emitted from an excimer laser light-emitting device through a mask having plural through-holes and having the image of the mask reduction-projected by a projection lens, and irradiating a surface of a plate glass substrate having a thickness of from 0.01 to 5 mm, an $SiO_2$ content of from 50 to 70 mass % and an average thermal expansion coefficient of from $10 \times 10^{-7}$/K to $50 \times 10^{-7}$/K within a range of from 50° C. to 300° C. with the reduction-projected excimer laser light so as to form through-holes corresponding to the through-holes of the mask in the plate glass substrate.

It is difficult to form through-holes by simply emitting laser light to a plate glass. Through-holes may be formed by increasing the irradiation fluence (energy density) of the laser light in some cases, but since glass is a brittle material, cracks are likely to be formed. Further, if the irradiation fluence of the laser light is decreased, through-holes cannot be formed, and depending on the type of the laser light or the nature of the plate glass, cracks are formed. The present inventors have conducted extensive studies and found that by selecting excimer laser light from various kinds of laser light, and emitting the excimer laser light to a plate glass having a specific range of an average thermal expansion coefficient within a range of from 50 to 300° C., a glass substrate having through-holes can be formed without forming cracks. Thus, the present invention has been accomplished. Further, the present inventors have found an appropriate irradiation fluence. Further, the present inventors have found that by emitting excimer laser light so that the product of the irradiation fluence, the number of shots and the thickness of the plate glass substrate falls within the specific range, better through-holes can be formed. Further, the present inventors have found that by controlling the irradiation fluence, through-holes having the desired taper angle can be formed. That is, the present inventors have found that when specific laser light is emitted to a specific plate glass, excellent through-holes can be formed.

Further, in the production process of the present invention, excimer laser light is emitted to the specific plate glass through a mask having plural through-holes. Since the mask having plural through-holes is used, the processing efficiency of the process of the present invention is remarkably higher than 1 beam processing.

The production process of the present invention will be described with reference to FIG. 2.

Figure 2:
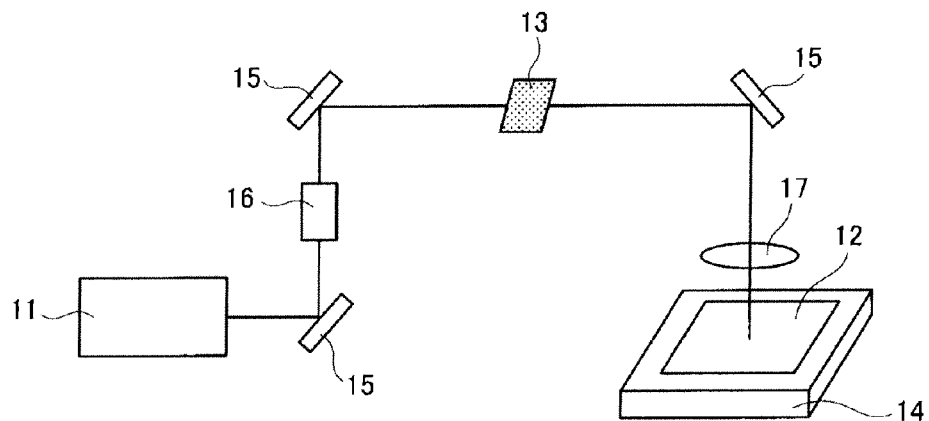
FIG. 2 is a schematic view for illustrating a preferred example of the production process of the present invention.

FIG. 2 is a schematic view for illustrating a preferred example of the production process of the present invention.

In the production process of the present invention, an excimer laser light-emitting device 11 is placed at first (first step).

Then, a plate glass 12 to be processed is placed on an optical path of the excimer laser light (second step). Here, the plate glass 12 is placed on the upper surface of a stage 14. The plate glass 12 can be transferred to an optional position on the upper surface of the stage 14.

Then, a mask having plural through-holes 13 is placed on the optical path between excimer laser light-emitting device 11 and the plate glass 12 (third step).

Then, a projection lens 17 is placed on the optical path between the mask 13 and the plate glass 12 to reduction-project the image of the mask 13 on the plate glass 12 (fourth step).

Further, in this preferred example, a mirror 15 for changing the optical path of the excimer laser light and a homogenizer 16 for making the intensity of the excimer laser light uniform are placed.

After placing as mentioned above, excimer laser light is emitted from the emitting device 11. Then, the excimer laser light is passed through the homogenizer 16 so that the intensity is made to be uniform and after being passed through the mask 13, it is reduction-projected by the projection lens 17 to reach the plate glass 12. Then, the excimer laser light is emitted to the plate glass 12 (fifth step) to form through-holes in the plate glass 12.

After forming the through-holes, the emission of the excimer laser light is temporarily stopped, the plate glass 12 is transferred on the stage 14, and the excimer laser light is emitted again. By repeating this step, the through-holes can be formed on the desired part on the surface of the plate glass 12. That is, the known step and repeat method can be employed.

<First Step>

So long as excimer laser light has an oscillation wavelength of at most 250 nm, such excimer laser may be used in the production process of the present invention. However, from the viewpoint of the output, KrF excimer laser (wavelength of 248 nm), ArF excimer laser (193 nm) and $F_2$ excimer laser (wavelength of 157 nm) are preferred. From the viewpoint of the handling efficiency and the absorption on glass, ArF excimer laser is more preferred.

Further, when excimer laser light having a short pulse width is used, the thermal diffusion distance at an irradiated part of the plate glass becomes short, and the influence of heat on the plate glass can be preferably reduced. From such a viewpoint, the pulse width of the excimer laser light is preferably at most 100 nsec, more preferably at most 50 nsec, further preferably at most 30 nsec.

Further, the irradiation fluence of the excimer laser light is preferably at least 1 J/cm², more preferably at least 2 J/cm². If the irradiation fluence is too low, ablation cannot be induced, and it is difficult to form through-holes through the plate glass. On the other hand, if the irradiation fluence exceeds 20 J/cm², cracks or breakage tends to result on the plate glass. The preferred range of the irradiation fluence of the excimer laser light varies depending on the wavelength range of the excimer laser light to be used or the type of the plate glass to be processed, etc., however, in the case of KrF excimer laser (wavelength 248 nm), the irradiation fluence is preferably from 2 to 20 J/cm². Further, in the case of ArF excimer laser (wavelength: 193 nm), the irradiation fluence is preferably from 1 to 15 J/cm².

Further, unless otherwise specified, the value of the irradiation fluence of the excimer laser light is a value on the surface of the plate glass to be processed. Further, such an irradiation fluence is a value measured by using an energy meter on the surface to be processed.

<Second Step>

In the production process of the present invention, the plate glass means glass before forming through-holes. The glass substrate (the glass substrate of the present invention) is the plate glass in which the desired through-holes are formed by emitting excimer laser light.

<Third Step>

The material of the mask used in the production process of the present invention is not particularly restricted. For example, chromium or stainless may be mentioned. Further, a mask made of a dielectric material may be used. A chromium mask is preferred from the viewpoint of a low cost. However, it is necessary to lower the irradiation fluence of the excimer laser light to at most 50 mJ/cm$^2$ when it is passed through the chromium mask. In a case where excimer laser light having the irradiation fluence of higher than 50 mJ/cm$^2$ is used, a mask formed by punching processing of a metal or a mask made of a dielectric material is preferably used.

Further, the size of the mask, the size of holes formed through the mask, the positions of holes, etc. are not particularly restricted.

<Fourth Step>

The project lens to be used in the production process of the present invention will be described.

Through-holes are preferably formed all at once by emitting excimer laser light on the entire region of the surface of the plate glass to be processed. However, in such a case, it is difficult to obtain enough irradiation fluence to form the through-holes. Therefore, in practice, the irradiation fluence required for forming through-holes is secured by reduction-projecting excimer laser light which has been passed through a mask by a projection lens to increase the irradiation fluence of the excimer laser light on the surface of the plate glass.

By reduction-projecting the image by the projection lens, the cross sectional area of the excimer laser light which has been passed through the mask is reduced to $\frac{1}{10}$ on the surface of the plate glass, whereby the irradiation fluence can be increased to 10 times. When the cross sectional area of the excimer laser is reduced to $\frac{1}{100}$ by using a projection lens having a reduction ratio of $\frac{1}{10}$, the irradiation fluence on the surface of the plate glass can be increased to 100 times, as compared to immediately after the emission from the emitting device.

The most suitable projection lens is selected optionally depending on the reduction ratio of the mask and the position of optical devices.

<Fifth Step>

When emitting excimer laser light, the number of shots can be controlled by controlling repeating frequency of the excimer laser light and emission time:

(The number of shots=repeating frequency×emission time).

The excimer laser light is preferably emitted to a plate glass so that the product of the irradiation fluence (J/cm$^2$), the number of shots (times) and the thickness of the plate glass (mm) becomes from 1,000 to 30,000. Although the above range depends on the type and properties (particularly, considered to be related to the glass transition temperature $T_g$) of the plate glass, the above range is preferably from 1,000 to 20,000, more preferably from 2,000 to 15,000, particularly preferably from 3,000 to 10,000. When the product of the irradiation fluence and the number of shots is within the above range, cracks formation can be more prevented. Here, the irradiation fluence is preferably from 1 to 20 J/cm$^2$.

Further, when the irradiation fluence of the excimer laser light is high, the taper angle tends to be small. On the other hand, when the irradiation fluence is low, the taper angle tends to be large. Thus, by controlling the irradiation fluence, the glass substrate of the present invention having the desired taper angle of through-holes can be obtained.

<Sixth Step>

The wafer size for producing semiconductor circuits is usually about from 6 to 8 inch. Further, in a case where the image is reduction-projected by a projection lens as mentioned above, the region to be processed on the surface of the plate glass is usually at a level of a few mm$^2$. Accordingly, after processing one part, excimer laser light or the plate glass is transferred and then the next part is processed, so that the excimer laser light can be emitted to the entire region to be processed on the plate glass. The plate glass is preferably transferred to the excimer laser light. In such a case, it is not necessary to move the optical system.

Further, if excimer laser light is emitted to a plate glass, debris (scattered substance) may be formed and accumulate in through-holes to thereby deteriorate the processing quality or processing efficiency in some cases. In such a case, at the same time as the laser emission, debris can be removed by suction or blowing away.

The glass substrate of the present invention is preferably used for a semiconductor device component, particularly an insulating layer for multilayer circuit boards, a wafer level package, through-holes for providing electrodes or an interposer.

EXAMPLES

Now, Examples of the present invention will be described.

Example 1

The glass substrate of the present invention was produced by the method described with reference to FIG. 2.

First, an excimer laser light-emitting device (11) was placed as shown in FIG. 2. Here, as the excimer laser light-emitting device (11), LPX Pro305 (manufactured by COHERENT Japan, Inc.) was used. By using this device, ArF excimer laser light (maximum pulse energy: 0.6 J, repeating frequency: 50 Hz, pulse width: 25 ns, beam size at the time of emission: 10 mm×24 mm, oscillation frequency: 193 nm) can be emitted.

Next, a plate glass (12) having a thickness of 0.3 mm, a thermal expansion coefficient of $38\times10^{-7}$/K, an SiO$_2$ content of 60 mass %, an Fe content of 0.05 mass % as calculated as oxide of Fe$_2$O$_3$ and the total content of Na and K of less than 0.1 mass % as calculated as oxides (AN100, manufactured by Asahi Glass Company, Limited) was placed on a stage so as to be on an optical path of excimer laser light as shown in FIG. 2. On the upper surface of the stage (14), the plate glass (12) can be transferred to an optional position.

Figure 3:
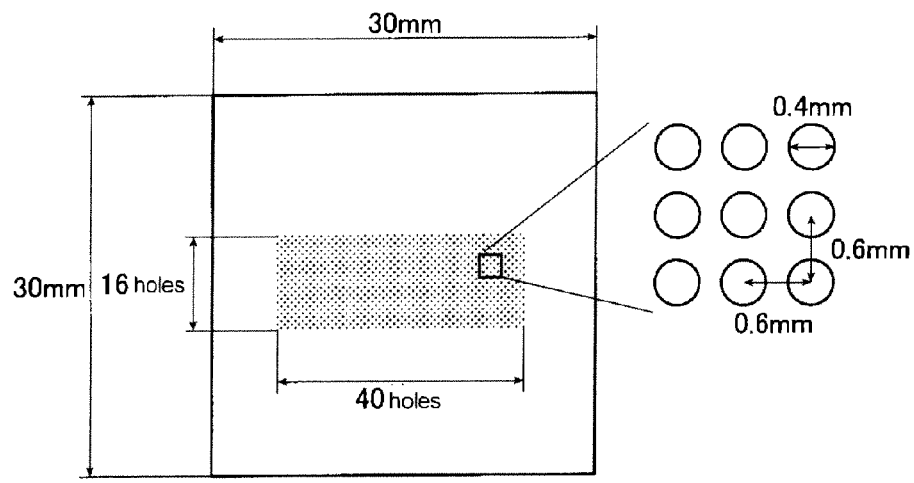
FIG. 3 is a schematic view illustrating a mask pattern used in Examples.

Next, a mask (13) was placed. FIG. 3 shows a schematic view of the mask (13). As shown in FIG. 3, the mask (13) used in the Examples is one having 16 (lengthwise)×40 (crosswise) holes with a diameter of 0.4 mm formed around the center of an SUS plate having a size of 30 mm×30 mm and a thickness of 0.5 mm at pitches of 0.6 mm (interval between the center of adjacent through-holes).

Next, a projection lens (17) was placed. The projection lens (17) is a lens having a focal distance of 100 mm and was placed so that the distance from the mask (13) on the optical path became 1,100 mm, and the distance from a surface to be processed of the plate glass (12) became 110 mm. In such a case, the reduction ratio of the projection lens (17) became $\frac{1}{10}$, and a mask pattern reduced to $\frac{1}{10}$ was projected on the plate glass (12). That is, excimer laser light having a beam size of 10 mm×24 mm immediately after the emission from the emitting device (11) was reduced to a beam size of 1.0 mm×2.4 mm when reached the surface to be processed (the main surface which is not in contact with the stage (14)) of the plate glass (12). That is, the area of the image was reduced to $\frac{1}{100}$.

Further, the irradiation fluence of the excimer laser light on the surface to be processed was measured by an energy meter. As a result, the irradiation fluence was at a level of the maximum 11 J/cm² together with the reduction due to a loss in the beam transmission system or the like and the increase by the beam reduction.

By the above method and using the above devices, excimer laser light was emitted to a surface to be processed of the plate glass (12). The irradiation fluence was controlled so as to be 5 J/cm² on the surface to be processed of the plate glass (12), and the excimer laser light was emitted until through-holes were formed, and the number of shots was obtained from irradiation time at the time of the formation of the through-holes. The repeating frequency of the used excimer laser light was 50 Hz, the irradiation time until forming through-holes was 780 seconds, and the number of shots was calculated to be 3,900 shots (780 seconds×50=3,900 shots).

Figure 4A:
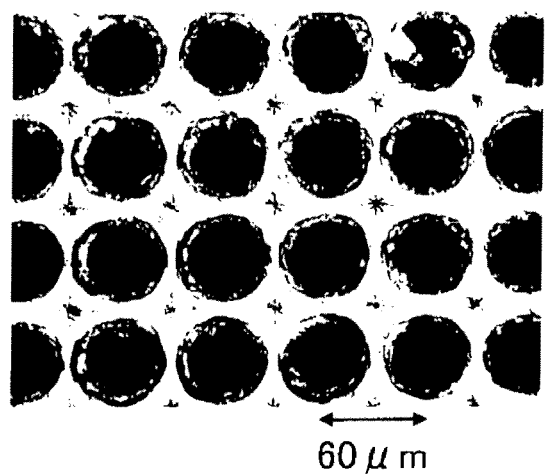
FIG. 4 is an enlarged photograph of the main surface ((a) one main surface (b) the other main surface) of the glass substrate having through-holes formed in the Examples.
Figure 4B:
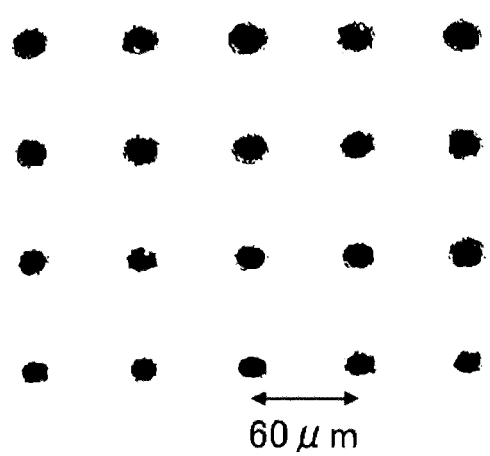

FIG. 4 shows an enlarged photograph (200 times) of a part of the main surface of the glass substrate in which through-holes were formed by emitting 3,900 shots of excimer laser light at 5 J/cm². From the photograph of FIG. 4, it was confirmed that 16×40=640 through-holes were formed simultaneously. Many through-holes having a circular cross sectional shape and a diameter of 40 μm with pitches of 60 μm were formed on a laser incident side (one main surface, FIG. 4(*a*)), and at an output side (the other main surface, FIG. 4(*b*)), the diameter was about 13 μm. That is, through-holes having a taper angle (α) of 2.6° were formed. Further, the number density of the through-holes was 289/mm². Further, it was confirmed that the obtained glass substrates had no crack, residual stress or deformation.

Example 2

Next, excimer laser light was emitted by changing a mask pattern to one hole of φ1.7 mm in order to more accurately measure the dependence of the irradiation fluence on the taper angle. Other than the mask, optical members and optical positions were the same as in Example 1. The same plate glass was used. The irradiation fluence was 5 J/cm², 7 J/cm², 9 J/cm² or 11 J/cm².

As a result, when the laser was emitted at 5 J/cm², 7 J/cm², 9 J/cm² and 11 J/cm², the number of shots until forming through-holes, was 3,900, 3,400, 3,100 and 2,800 respectively. Further, when the laser was emitted at 9 J/cm² or 11 J/cm², cracks were slightly formed, however, such cracks were at no problematic level in practical use. The quality of the glass substrate obtained by 3,900 shots at 5 J/cm² and the glass substrate obtained by 3,400 shots at 7 J/cm² was superior. That is, few cracks were formed.

The condition of through-holes and the observation results in respective cases are shown in Table 1. In Table, ○ means that there is no crack nor deformation, and Δ means that cracks and deformation are slightly formed. Further, in Table 2, the taper angle of the through-holes and the diameter of the through-holes formed in respective conditions are shown.

TABLE 1

| The irradiation fluence | The number of shots | | | |
|---|---|---|---|---|
| (J/cm²) | 2,800 | 3,100 | 3,400 | 3,900 |
| 5 | Δ | Δ | Δ | ○ |
| 7 | Δ | Δ | ○ | |
| 9 | Δ | Δ | | |
| 11 | Δ | | | |

TABLE 2

| The irradiation fluence [J/cm²] | The number of shots [times] | The diameter of through-holes [μm] | The diameter of through-holes on the other main surface [μm] | Taper angle [degree] |
|---|---|---|---|---|
| 5 | 3,900 | 170 | 80 | 8.5 |
| 7 | 3,400 | 166 | 93 | 6.9 |
| 9 | 3,100 | 173 | 107 | 6.3 |
| 11 | 2,800 | 165 | 130 | 3.3 |

It is evident from Table 2 that the taper angle of the through-holes was changed by the irradiation fluence. That is, it was found that the taper angle can be controlled by the irradiation fluence.

Further, as mentioned above, when the irradiation fluence was 5 J/cm² in Example 2, the taper angle was 8.5°, and since the taper angle in Example 1 was 2.6°, the taper angle was changed. The present inventors consider that the taper angle is also influenced by the diameter of the through-holes in addition to the irradiation fluence.

Example 3

The same experiment as in Example 2 was carried out, except that instead of AN100 glass, SW glass (manufactured by Asahi Glass Company, Limited) having a thickness of 0.3 mm, a thermal expansion coefficient of 36×10⁻⁷/K, an $SiO_2$ content of 65 mass %, an Fe content as calculated as oxides of $Fe_2O_3$ of 50 mass % and the total content of Na and K as calculated as oxides of 3 mass % was used.

As a result, when the laser light was emitted at 5 J/cm², 7 J/cm², 9 J/cm² and 11 J/cm², the number of shots until forming through-holes was 3,000, 2,800, 2,500 and 2,300 respectively. Further, in all cases, the condition of the through-holes was excellent, and cracks and deformation were not formed.

The condition of the through-holes and the observation results of respective cases are shown in Table 3. In Table, ○ means that there is no crack nor deformation, and Δ means cracks and deformation are slightly formed. Further, in Table 4, the taper angle and the diameter of the through-holes formed under various conditions for emitting excimer laser light are shown. It is evident from Table 4 that the taper angle of the through-holes is changed by the irradiation fluence. That is, it is possible to control the taper angle by the irradiation fluence.

TABLE 3

| The irradiation fluence | The number of shots | | | |
|---|---|---|---|---|
| (J/cm²) | 2,300 | 2,500 | 2,800 | 3,000 |
| 5 | Δ | Δ | Δ | ○ |
| 7 | Δ | Δ | ○ | |
| 9 | Δ | ○ | | |
| 11 | ○ | | | |

TABLE 4

| The irradiation fluence [J/cm²] | The number of shots [times] | The diameter of through-holes [μm] | The diameter of through-holes on the other main surface [μm] | Taper angle [degree] |
|---|---|---|---|---|
| 5 | 3,000 | 174 | 95 | 7.5 |
| 7 | 2,800 | 170 | 93 | 7.3 |
| 9 | 2,500 | 165 | 98 | 6.4 |
| 11 | 2,300 | 172 | 130 | 4.9 |

Comparative Example 1

The same experiment as in Example 2 was carried out, except that instead of AN100 glass, Pyrex glass (manufactured by AGC TECHNO GLASS CO., LTD.) having a thickness of 0.3 mm, a thermal expansion coefficient of $33 \times 10^{-7}$/K, an $SiO_2$ content of 81 mass %, and the total content of Na and K as calculated as oxides of 4.0 mass % was used.

As a result, when the laser light was emitted at 5 J/cm², 7 J/cm², 9 J/cm² and 11 J/cm², cracks or deformation was formed. It is considered that since the content of $SiO_2$ in the glass substrate was increased, the mechanical property of the glass was changed.

Further, as shown in Table 5, the glass substrates in Example 1 and Example 2 have a low dielectric constant and dielectric loss, and therefore the glass substrates can be preferably used for the production of devices having excellent properties.

TABLE 5

|  | Ex. 1 | Ex. 2 | Ex. 3 | Comp. Ex. 1 |
|---|---|---|---|---|
| Dielectric constant (25° C., 1 MHz) | 5.7 | 5.7 | 6.1 | 4.6 |
| Dielectric loss (25° C., 1 MHz) | 0.002 | 0.002 | 0.01 | 0.01 |

As mentioned above, a glass substrate having through-holes can be easily produced by emitting laser light to a plate glass to form plural through-holes simultaneously. Further, in a case where the obtained glass substrate is laminated on and bonded to a silicon wafer, the glass substrate is not likely to peel from the silicon wafer. Further, when the glass substrate is used as an interposer, problems such as deformation are not likely to occur, and excellent device properties can be obtained.

INDUSTRIAL APPLICABILITY

The glass substrate of the present invention can be preferably used as a glass substrate for a semiconductor device component, particularly an insulating layer for multilayer circuit boards, wafer level package, through-holes for providing electrodes or an interposer.

Further, the production process of the present invention is useful for producing a glass substrate having plural micro through-holes for the above applications.

The entire disclosure of Japanese Patent Application No. 2009-021751 filed on Feb. 2, 2009 including specification, claims, drawings and summary is incorporated herein by reference in its entirety.

| EXPLANATION OF NUMERICALS | |
|---|---|
| 1: | Glass substrate |
| 1a: | One main surface |
| 1b: | The other main surface |
| 1c: | Wall surface |
| 5: | Through-hole |
| α: | Taper angle |
| L: | Diameter of through-hole |
| 11: | Excimer laser light-emitting device |
| 12: | Plate glass |
| 13: | Mask |
| 14: | Stage |
| 15: | Mirror |
| 16: | Homogenizer |
| 17: | Projection lens |

What is claimed is:

1. A glass substrate for a semiconductor device component, which is a glass plate having a thickness of from 0.01 to 5 mm, an $SiO_2$ content of from 50 to 70 mass %, an Fe content of from 20 mass ppm to 0.1 mass % and an average thermal expansion coefficient of from $10 \times 10^{-7}$ to $50 \times 10^{-7}$/K within a range of from 50° C. to 300° C., wherein the glass plate has plural through-holes with a taper angle of from 0.1 to 20°.

2. The glass substrate for a semiconductor device component according to claim 1, wherein the through-holes have a diameter of from 5 to 500 μm.

3. The glass substrate for a semiconductor device component according to claim 1, wherein the through-holes have a number density of from 1 to 10,000/mm².

4. The glass substrate for a semiconductor device component according to claim 1, which has an $SiO_2$ content of from 50 to 70 mass % and the total content of Na and Ka of at most 3.5 mass % as calculated as oxides.

5. A process for producing the glass substrate for a semiconductor device component as defined in claim 1 by emitting excimer laser light to a plate glass, which comprises the following steps (1) to (6):
   (1) a first step of placing an excimer laser light-emitting device,
   (2) a second step of placing the plate glass on an optical path of the excimer laser light,
   (3) a third step of placing a mask having plural through-holes on the optical path between the excimer laser light-emitting device and the plate glass,
   (4) a fourth step of placing a projection lens on the optical path between the mask and the plate glass to reduction-project the image of the mask on the plate glass,
   (5) a fifth step of emitting the excimer laser light, and
   (6) a sixth step of transferring the plate glass.

6. The process for producing the glass substrate for a semiconductor device component according to claim 5, wherein the fifth step is a step of emitting the excimer laser light having irradiation fluence of from 2 to 20 J/cm² so that the product of the irradiation fluence (J/cm²), the number of shots (times) and the thickness of the plate glass (mm) becomes from 1,000 to 3,000.

7. The process for producing the glass substrate for a semiconductor device component according to claim 5, wherein the fifth step is a step of further controlling the irradiation fluence to control a taper angle of the through-holes.

8. The process for producing the glass substrate for a semiconductor device component according to claim 5, wherein the excimer laser light at the fifth step is KrF laser, ArF laser or $F_2$ laser.

9. A process for producing a glass substrate for a semiconductor device component, which comprises passing excimer laser light emitted from an excimer laser light-emitting device through a mask having plural through-holes and having the image of the mask reduction-projected by a projection lens, and irradiating a surface of a plate glass substrate having a thickness of from 0.01 to 5 mm, an $SiO_2$ content of from 50 to 70 mass %, a Fe content of from 20 mass ppm to 0.1 mass % and an average thermal expansion coefficient of from $10 \times 10^{-7}$/K to $50 \times 10^{-7}$/K within a range of from 50° C. to 300° C. with the reduction-projected excimer laser light so as to form through-holes corresponding to the through-holes of the mask in the plate glass substrate.

10. The process for producing the glass substrate for a semiconductor device component according to claim 9, wherein the excimer laser light having irradiation fluence of from 2 to 20 J/cm² is emitted so that the product of the irradiation fluence (J/cm$^2$), the number of shots (times) and the thickness of the plate glass (mm) becomes from 1,000 to 30,000.

11. The process for producing the glass substrate for a semiconductor device component according to claim 9, wherein the irradiation fluence is controlled to control a taper angle of the through-holes.

12. The process for producing the glass substrate for a semiconductor device component according to claim 10, wherein the excimer laser light is KrF laser, ArF laser or F$_2$ laser.

* * * * *